(12) United States Patent
Andrews (10) Patent No.: US 7,521,728 B2
(45) Date of Patent: Apr. 21, 2009

(54) PACKAGES FOR SEMICONDUCTOR LIGHT EMITTING DEVICES UTILIZING DISPENSED REFLECTORS AND METHODS OF FORMING THE SAME

(75) Inventor: Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 91 days.

(21) Appl. No.: 11/336,369

(22) Filed: Jan. 20, 2006

(65) Prior Publication Data

US 2007/0170454 A1 Jul. 26, 2007

(51) Int. Cl.
  *H01L 27/15* (2006.01)
(52) U.S. Cl. .................. 257/100; 257/99; 257/E33.059
(58) Field of Classification Search .................. 257/98, 257/99, 100, 81
  See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter, Jr. | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,731,547 A * | 3/1998 | Derwin et al. | 174/251 |
| 5,739,554 A | 4/1998 | Edmond et al. | |
| 5,912,477 A | 6/1999 | Negley | |
| 5,962,810 A * | 10/1999 | Glenn | 174/524 |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,730,933 B1 * | 5/2004 | Shimizu et al. | 257/79 |
| 7,145,182 B2 * | 12/2006 | Peh | 257/98 |
| 2002/0123164 A1 | 9/2002 | Slater et al. | |
| 2003/0006418 A1 | 1/2003 | Emerson et al. | |
| 2003/0227025 A1 * | 12/2003 | Ochi et al. | 257/100 |
| 2004/0000727 A1 * | 1/2004 | Hsu | 257/787 |
| 2004/0056260 A1 | 3/2004 | Slater et al. | |
| 2004/0159850 A1 * | 8/2004 | Takenaka | 257/98 |
| 2005/0035365 A1 * | 2/2005 | Sato et al. | 257/100 |
| 2005/0221519 A1 * | 10/2005 | Leung et al. | 438/27 |
| 2006/0076568 A1 * | 4/2006 | Keller et al. | 257/98 |
| 2006/0092644 A1 * | 5/2006 | Mok et al. | 362/327 |

(Continued)

*Primary Examiner*—Jack Chen
*Assistant Examiner*—Matthew Reames
(74) *Attorney, Agent, or Firm*—Myers Bigel Sibley & Sajovec (57) ABSTRACT

A packaged LED includes a substrate, an LED chip on the upper surface of the substrate, a first encapsulant material, including a reflective material, on the substrate and spaced apart from the LED chip, and a second encapsulant material on the LED chip. A method of forming a packaged LED includes forming a first meniscus control feature on a substrate and defining a first region of the substrate, forming a second meniscus control feature surrounding the first region and defining a second region of the substrate between the first meniscus control feature and the second meniscus control feature, mounting an LED chip within the first region, dispensing a first encapsulant material including a reflective material within the second region, curing the first encapsulant material, dispensing a second encapsulant material on the substrate within the first region, and curing the second encapsulant material.

20 Claims, 6 Drawing Sheets

U.S. PATENT DOCUMENTS

2006/0261360 A1* 11/2006 Takehashi et al. ............. 257/98
2006/0261364 A1* 11/2006 Suehiro et al. .............. 257/100
2006/0278882 A1* 12/2006 Leung et al. ................... 257/98
2007/0034887 A1* 2/2007 Pang et al. .................... 257/98

* cited by examiner

PACKAGES FOR SEMICONDUCTOR LIGHT EMITTING DEVICES UTILIZING DISPENSED REFLECTORS AND METHODS OF FORMING THE SAME

FIELD OF THE INVENTION

This invention relates to semiconductor light emitting devices and methods of fabricating semiconductor light emitting devices, and more particularly to packages and packaging methods for semiconductor light emitting devices.

BACKGROUND

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

Figure 1A:
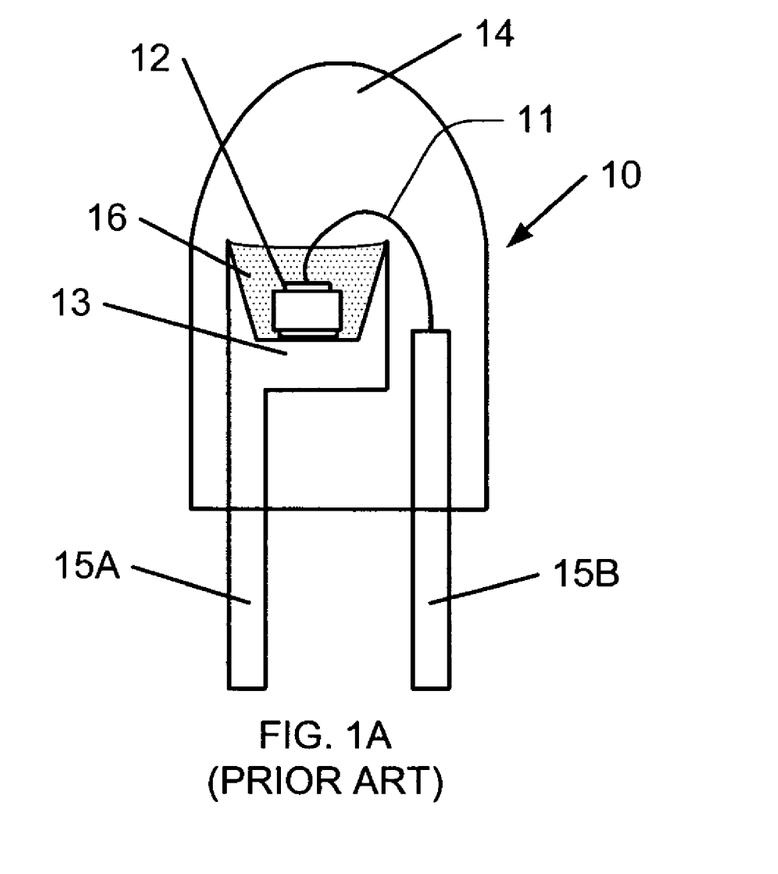
FIGS. 1A and 1B are cross-sectional side views illustrating conventional light emitting device packages.

In order to use an LED chip in a circuit, it is known to enclose an LED chip in a package to provide environmental and/or mechanical protection, color selection, focusing and the like. An LED package also includes electrical leads, contacts or traces for electrically connecting the LED package to an external circuit. In a typical LED package 10 illustrated in FIG. 1A, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup instead of being reflected). In addition, heat retention may be an issue for a package such as the package 10 shown in FIG. 1A, since it may be difficult to extract heat through the leads 15A, 15B.

Figure 1B:
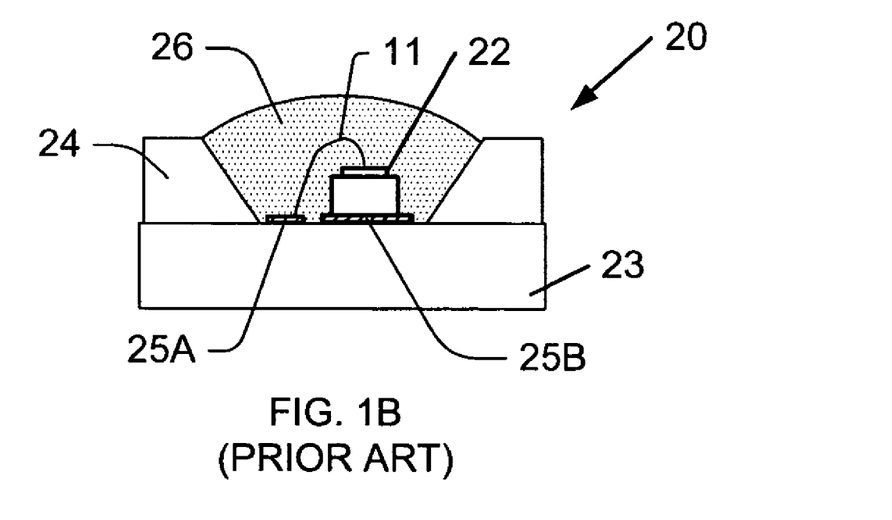

A conventional LED package 20 illustrated in FIG. 1B may be more suited for high power operations which may generate more heat. In the LED package 20, one or more LED chips 22 are mounted onto a carrier such as a printed circuit board (PCB) carrier 23. A metal reflector 24 mounted on the carrier 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the carrier 23. The mounted LED chips 22 are then covered with an encapsulant 26, which may provide environmental and mechanical protection to the chips while also acting as a lens. The metal reflector 24 is typically attached to the carrier by means of a solder or epoxy bond.

While a package such as the package 20 illustrated in FIG. 1B may have certain advantages for high power operation, there may be a number of potential problems associated with using a separate metal piece as a metal reflector. For example, small metal parts may be difficult to manufacture repeatably with a high degree of precision at a reasonable expense. In addition, since the reflector is typically affixed to a carrier using an adhesive, several manufacturing steps may be required to carefully align and mount the reflector, which may add to the expense and complexity of the manufacturing process for such packages.

SUMMARY

A packaged LED according to some embodiments of the invention includes a substrate, an LED chip positioned on the substrate, a first encapsulant material including a reflective material on the substrate, the first encapsulant material spaced apart from the LED chip and configured to reflect at least a portion of light emitted by the LED chip, and a second encapsulant material on the LED chip. The first encapsulant material may surround the LED chip and define a cavity around the LED chip The packaged LED may further include a third encapsulant material on the first encapsulant material and on the second encapsulant material.

The first encapsulant material may have a generally annular shape. The first encapsulant material forms a generally semi-toroidal three dimensional geometric shape.

The first encapsulant material may include a silver epoxy and/or a silicone. The reflective material may include silver chrome flakes, TiO$_2$ and/or SiO$_2$ particles.

In some embodiments, the reflective material may be coated on the first encapsulant material.

The second encapsulant and/or or the third encapsulant may include a wavelength conversion material. In some embodiments, a lens may be positioned above the second encapsulant material, and the reflective material may be configured to reflect light emitted from the LED chip through the lens.

A packaged LED according to further embodiments of the invention includes a submount including a substrate, an LED chip positioned on the substrate, a first meniscus control feature on the substrate, the first meniscus control feature defining an encapsulant region around the LED chip, and a second meniscus control feature on the substrate, the second meniscus control feature surrounding the encapsulant region and defining a region of the substrate between the first meniscus control feature and the second meniscus control feature, a first encapsulant material on the substrate within the region defined by the first meniscus control feature and the second meniscus control feature, the first encapsulant material including a reflective material and defining a cavity around the LED chip, and a second encapsulant material within the cavity. The first encapsulant material may include silicone.

The packaged LED may further include a third meniscus control feature surrounding the second meniscus control feature, and a third encapsulant material deposited on the first encapsulant material and the second encapsulant material within a region defined by the third meniscus control feature.

The packaged LED may further include a third encapsulant material deposited on the first encapsulant material and the second encapsulant material. The first encapsulant material may include a silver epoxy.

The region of the substrate between the first meniscus control feature and the second meniscus control feature may be generally annular.

The reflective material may include silver chrome flakes, and/or $TiO_2$ and/or $SiO_2$ particles. In some embodiments, the reflective material may be coated on the first encapsulant material. In some embodiments, the packaged LED may include a lens positioned above the LED chip, and the reflective material may be configured to reflect light emitted from the LED chip through the lens.

The substrate may include a printed circuit board (PCB). The die attach pad and the first and second meniscus control features include metal traces. The first and/or second meniscus control features may include a metal film. The die attach pad and the first and second meniscus control features may include the same material. The first and/or second meniscus control features may include a plated metal film or a polymer feature.

A packaged LED according to some embodiments of the invention includes a substrate, an LED chip on the substrate, a semi-toroidal reflector on the substrate surrounding the LED chip and configured to reflect at least a portion of light emitted by the LED chip, and an encapsulant material on the LED chip. The semi-toroidal reflector may include a cured encapsulant material.

The encapsulant material may include a silver epoxy or silicone. The encapsulant material may include silver chrome flakes, and/or $TiO_2$ and/or $SiO_2$ particles.

The packaged LED may further include a second encapsulant material on the LED chip. The second encapsulant material may include a wavelength conversion material. In some embodiments, a lens may be mounted above the second encapsulant material.

A method of forming a packaged LED according to some embodiments of the invention includes providing a substrate including thereon a first meniscus control feature defining a first region of the substrate and a second meniscus control feature surrounding the first encapsulant region and defining a second region of the substrate between the first meniscus control feature and the second meniscus control feature, mounting an LED chip within the first region of the substrate, dispensing a first encapsulant material within the second region, the first encapsulant material including a reflective material, curing the first encapsulant material, dispensing a second encapsulant material on the substrate within the first region, and curing the second encapsulant material.

The method may further include dispensing a third encapsulant material over the first encapsulant material and the second encapsulant material, and curing the third encapsulant material.

The dispensed first encapsulant material may define a cavity around the LED chip. Dispensing the second encapsulant material may include dispensing the second encapsulant material into the cavity around the LED chip after curing the first encapsulant material. The second encapsulant material may include a wavelength conversion material.

The shape of the second region may be annular, and dispensing the first encapsulant material may include moving a dispensing needle in a circular motion.

Forming the first meniscus control feature and/or the second meniscus control feature may include forming a patterned metal film on the substrate. Alternatively, forming the first meniscus control feature and/or the second meniscus control feature may include forming a polymer feature on the substrate.

The first encapsulant material forms a generally semi-toroidal three dimensional geometric shape.

The first encapsulant material may include a silver epoxy and/or silicone. The reflective material may include silver chrome flakes, TiO2 and/or SiO2.

The first encapsulant material may include about 30% by volume of reflective material.

The method may further include forming a third meniscus control feature on the substrate surrounding the second meniscus control feature, dispensing the third encapsulant material may include dispensing the third encapsulant material within a region defined by the third meniscus control feature.

The third encapsulant material may include a wavelength conversion material.

A method of forming a packaged LED according to further embodiments of the invention includes mounting an LED chip on a substrate, dispensing a first encapsulant material on the substrate, the first encapsulant material including a reflective material and surrounding the LED chip to define an optical cavity around the LED chip, curing the first encapsulant material, dispensing a second encapsulant material on the substrate within the optical cavity, and curing the second encapsulant material.

Methods of forming a packaged LED according to further embodiments of the invention include providing a substrate having thereon a first meniscus control feature defining a first region of the substrate and a second meniscus control feature surrounding the first region and defining a second region of the substrate between the first meniscus control feature and the second meniscus control feature, mounting an LED chip within the first region of the substrate, and dispensing a first encapsulant material within the second region. T first encapsulant material is coated with a reflective material and is at least partially cured. A second encapsulant material is dispensed on the substrate within the first region and cured.

Coating the first encapsulant material with a reflective material may include blowing a reflective powder onto the first encapsulant material with an air jet. The reflective powder may include silver chrome flakes, and/or $TiO_2$ and/or $SiO_2$ particles.

DETAILED DESCRIPTION OF EMBODIMENTS OF THE INVENTION

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide and/or another microelectronic substrates. A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Figure 2A:
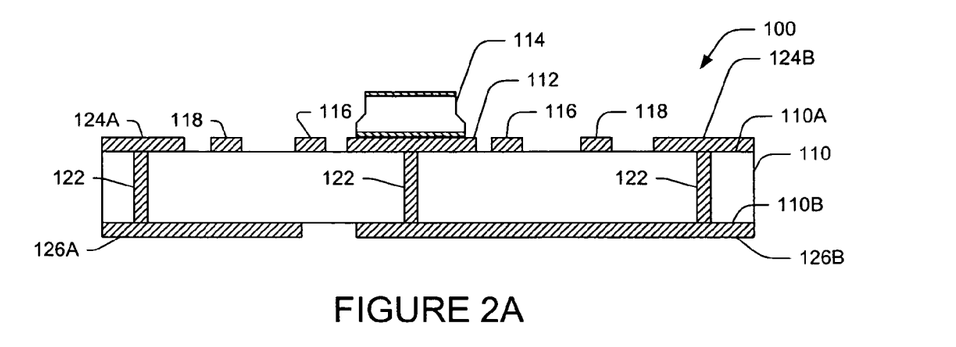
FIG. 2A is a cross-sectional view illustrating a light emitting device submount according to some embodiments of the invention.
Figure 2B:
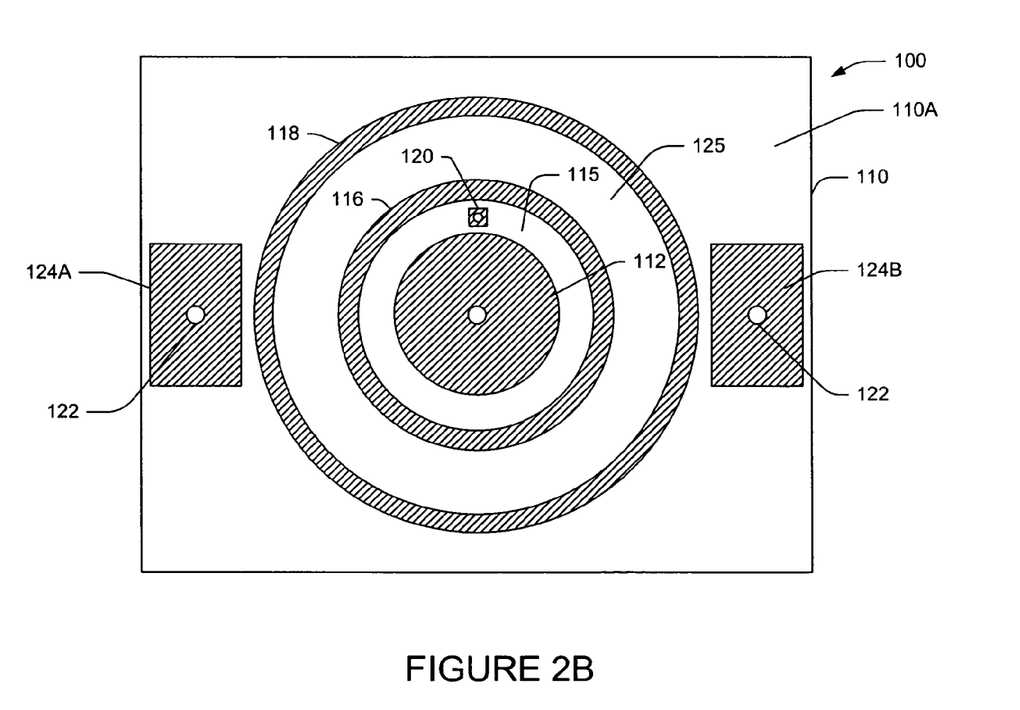
FIG. 2B is a top view illustrating the light emitting device submount of FIG. 2A.
Figure 2C:
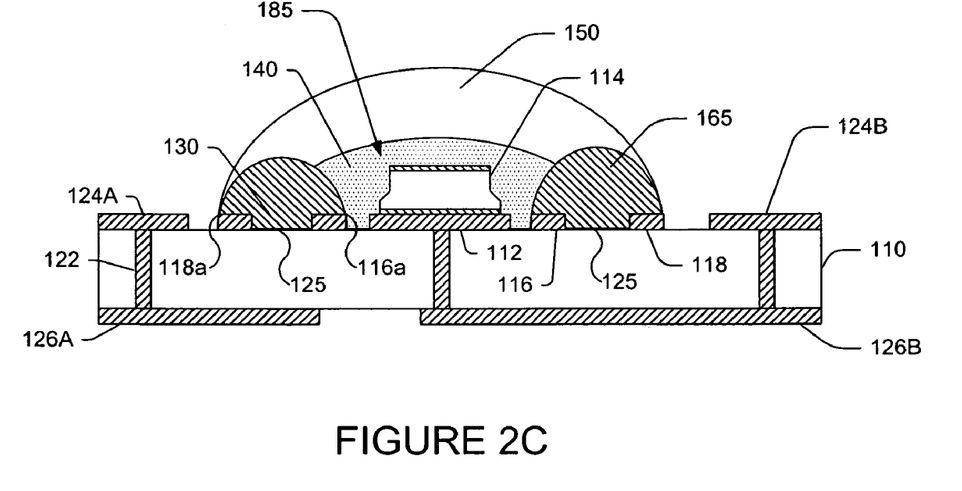
FIG. 2C is a cross sectional view illustrating a light emitting device package according to some embodiments of the invention utilizing the submount of FIG. 2A.

Referring to the embodiments of FIGS. 2A-2C, a submount 100 for mounting an LED chip 114 is illustrated. A submount 100 includes a substrate 110 having an upper surface 110A and a lower surface 110B. The substrate 110 may include a printed circuit board (PCB), an aluminum block, an alumina, aluminum nitride, sapphire, or silicon wafer, or any other suitable substrate material, such as T-Clad thermal clad insulated substrate material, available from The Bergquist Company of Chanhassen, Minn. The PCB may include standard FR-4 PCB, a metal-core PCB, flex tape, or any other type of printed circuit board.

As illustrated in FIGS. 2A-2C, a plurality of patterned metal features are formed on the upper surface 110A of the substrate 110. The patterned metal features may include, for example, a die attach pad 112, a first meniscus control feature 116, a second meniscus control feature 118, and/or electrodes 124. A wirebond pad 120 may be positioned on the upper surface 110A of the substrate 110. The conductive features on the top surface 110A of substrate 110 may be formed, for example, using a plating process. A plating process may be used to plate a thin or thick metallic film on a substrate. In a typical plating process, a titanium adhesion layer and a copper seed are sequentially sputtered onto a substrate. Then, approximately 75 microns of copper are plated onto the copper seed. Thus, a plating process may be utilized to form a metal film having a characteristic structure. A deposited metal film may be patterned using standard lithographic processes to produce metal films on the substrate having desired patterns. Alternatively, the adhesion layer and seed may be sputtered using, for example, a metal mask to form a desired pattern. A plating process may also be used to form conductive metal vias through a substrate.

In some embodiments of the invention, the first and second meniscus control features 116, 118 may be formed of a material different from the die attach pad 112 and/or the wirebond pad 120. For example, the meniscus control features 116, 118 may comprise a polymer such as a solder mask material including for example polyimide. In particular, a polymer such as polyimide may provide a suitable material for use as a meniscus control feature since polyimide may have a low surface energy, which may provide better meniscus control properties.

The conductive vias 122 may provide electrical contact between features formed on opposite sides of a substrate. Accordingly, respective conductive features formed on the upper surface of substrate 110 may be formed of the same material. For example, the conductive features may include copper deposited using a plating process. However, in some embodiments, some features may include additional metals. For example, the die attach pad 112 may be plated and/or coated with additional metals and/or other materials to make the die attach pad 112 more suitable for mounting an LED chip 114. For example, the die attach pad 112 may be plated with additional layers such as, for example, additional adhesive, bonding, reflector and/or barrier layers (not shown).

As illustrated in the embodiments of FIG. 2B, the die attach pad 112 may be located on the upper surface 110A of the substrate 110. The die attach pad 112 may be generally circular in shape, or may have any other desired shape. As further shown in FIG. 2B, the first meniscus control feature 116 formed on the substrate 110 encircles the die attach pad 112 and defines an encapsulant region 115 on the upper surface 110A of the substrate 110 within the periphery of the first meniscus control feature 116. The second meniscus control feature 118 surrounds the first encapsulant region 115 and, together with the first meniscus control feature, defines an annular, or ring-shaped, reflector region 125 on the upper surface 110A of the substrate 110 surrounding the first encapsulant region. As illustrated in FIG. 2B, the annular reflector region 125 may enclose and encompass the first encapsulant region 115. While in the embodiments illustrated in FIG. 2B the reflector region 125 is annular, the reflector region 125 may be other shapes depending on the shapes of the first meniscus control feature 116 and the second meniscus control feature 118. For example, the reflector region could have an oval periphery. It will be understood that for a feature to "encircle" or "surround" a region, the feature need not be continuously formed around the region. Although the figures illustrate continuous meniscus control features, it may be possible for a meniscus control feature to include gaps or voids therein which do not affect the meniscus control function of the feature. Moreover, the feature need not form a circle, but could be provided in other two dimensional shapes such as ellipses, polygons, etc.

The wirebond pad 120 may be formed on the upper surface 110A of substrate 110 within the encapsulant region 115. One or more of the electrodes 124 may also be formed on the upper surface 110A of the substrate 110. In addition, one or more lower electrodes 126 may be formed on a lower surface 110B of the substrate 110 as shown in FIG. 2A.

One or more conductive vias 122 may connect one or more of the lower electrodes 126A, 126B to various features on the upper surface 110A of the substrate 110. For example, one of the conductive vias 122 may electrically connect the electrodes 124A, 124B with respective lower electrodes 126A, 126B. Likewise, one of the conductive vias 122 may electrically connect the wire bond pad 120 with the lower electrode 126A, and/or one of the conductive vias 122 may electrically connect the die attach pad 112 with the lower electrode 126B.

As illustrated in FIG. 2C, the first encapsulant material 130 is dispensed within the annular reflector region 125 defined by the first meniscus control feature 116 and the second meniscus control feature 118. When the first encapsulant material 130 is dispensed within the reflector region 125, it may form a liquid meniscus (i.e. a curved bubble or dome) extending from the first meniscus control feature 116 to the second meniscus control feature 118. Surface tension in the liquid encapsulant material 130 may cause it to cling to the first meniscus control feature 116 and the second meniscus control feature 118. For example, the liquid encapsulant material 130 may cling to a corner 116a of the first meniscus control feature 116 and/or a surface of the first meniscus control feature 116 and a corner 118a of the second meniscus control feature 118 and/or a surface of the second meniscus control feature 118. For example, as illustrated in FIG. 2C, the encapsulant material 130 may cling to a corner 116a of the meniscus control feature 116 that is farthest from the center of the annular reflector region 125 and a corner 118a of the second meniscus control feature 118 that is farthest from the center of the reflector region 125. Since the reflector region 125 is generally annular (i.e. ring shaped), the dispensed first encapsulant material may form a generally semi-toroidal three-dimensional geometric shape over the reflector region 125. Alternatively, the liquid encapsulant material 130 may wet to the surface of the substrate 110 within the reflector region 125 and not wet to the meniscus control features 116, 118.

The dispensed first encapsulant material 130 may be cured, for example, by heating the encapsulant material for a suitable period of time at a suitable temperature, by allowing the dispensed encapsulant to sit for a suitable period of time at room temperature, by exposure to UV light, with the aid of a catalyst, and/or by other suitable techniques.

The first encapsulant material 130 may include a reflective material embedded therein, such that when the first encapsulant material 130 is cured and forms a hardened ring around the die attach pad 112 and the LED chip 114, the first encapsulant material 130 forms a reflective ring around the LED chip 114. In this manner, the first encapsulant material 130 may form a reflector 165 positioned to reflect light generated by the LED chip 114 away from the package 100. The reflector 165 may define an optical cavity 185 surrounding the LED chip 114. The height of the first encapsulant material 130 may be greater than, equal to, or less than the height of the mounted LED chip 114 on the die attach pad 112.

In order to form a dispensed reflector, the first encapsulant material 130 may include and/or be embedded with any of a number of materials. For example, the first encapsulant material 130 may include a silver epoxy. However, silver epoxy may be very difficult to dispense, as it may leave a large dispense tail. In addition, silicon epoxy may be somewhat lumpy, which may result in the reflector 165 having an uneven height.

The first encapsulant material 130 may alternatively include a silicone gel impregnated with a reflective substance. For example, the encapsulant material 130 may include a silicone gel such as 3221S manufactured by General Electric Corporation or a 6150 epoxy manufactured by Lord Thermoset or Shin-Etsu 1011. The silicone gel may include reflective metal flakes therein for reflectivity. For example, the silicone gel may be impregnated with silver chrome metal flakes, such as a 2 mil×2 mil paint powder, for reflectivity. Alternatively or additionally, the silicone gel may include $TiO_2$ or $SiO_2$ particles having, for example, an average radius less than 1 μm embedded therein for reflectivity. In particular, crushed and/or fumed $SiO_2$ may be used as a reflective material. $SiO_2$ glass beads/balls, which may be engineered to a desired size, may also be used as a reflective material. Such particles are commonly used to provide reflectivity for reflective paints. The silicone gel may include enough reflective material to cause the gel to be reflective, but not so much that cracks will form in the silicone upon curing. The amount of reflective material that will provide the appropriate reflective characteristics without cracking will depend on the particular encapsulant material and reflective material used. In some embodiments, a silicone gel may include about 30% by volume of reflective material.

By dispensing an encapsulant material 130 to form a reflector 165 and shaping the reflector 165 using meniscus control features 116, 118, the shape of the reflector 165 may be more accurately controlled compared to conventional reflector assembly, which may require manufacturing and assembling a separate piece part. Machining variations, plating variations and assembly placement inaccuracies may be avoided by the use of a dispensed reflector. In addition, by controlling the amount of reflective material in the silicone gel, it may be possible to control the reflectance of the reflector to a desired level. Thus, in applications wherein uniformity of emission is an issue, it may be possible to adjust the light output and/or beam angle by the package to account for variations in light emission from chip to chip.

An encapsulant material may be deposited in an annular region such as the reflector region 125 in for example, a circular pattern, by moving a dispensing needle in a circular motion as discussed in more detail below. In this manner, the desired pattern may be "drawn" onto the substrate with the needle. Alternatively, the encapsulant material may be dispensed at a location within the reflector region 125 and flow or wick around to cover other portions of the reflector region 125.

The height of the reflector 165 formed by the first encapsulant material 130 may also be more easily controlled or adjusted without having to design, manufacture and qualify a new reflector part for production. Accordingly, some embodiments of the present invention may provide substantial additional flexibility in a manufacturing process.

The dispensed first encapsulant material 130 may be cured, for example, by heating at an appropriate temperature for an appropriate time, to cause the first encapsulant material 130 to harden over the reflector region 125. It will be appreciated that a cure step may include a full and/or partial curing of an encapsulant material. A full cure may cause the liquid encapsulant material to harden completely, while a partial cure may cause the liquid encapsulant to only partially harden. For example, it may be desirable to partially cure a dispensed liquid encapsulant sufficient to permit a subsequent dispense and/or other process steps to be performed. A full cure may be performed after some or all subsequent dispenses have been performed. Alternatively, it may be desirable to perform a full cure after a dispense step.

As illustrated in the embodiments of FIG. 2C, a second encapsulant material 140 may be dispensed within the optical cavity 185 defined by the reflector 165 to cover the LED chip 114 mounted on the die attach pad 112. The second encapsulant material 140 may be dispensed within the optical cavity 185 using, for example, an automated dispense system. The second encapsulant material 140 may include a liquid silicone, an epoxy resin, and/or another suitable optical encapsulant material. The second encapsulant material 140 may include a wavelength conversion material, such as a phosphor and/or a nanocrystal, therein to convert a wavelength of light emitted by the LED chip 114 to a second wavelength.

A wirebond connection (not shown) may be formed between the LED chip 114 and a wire bond pad 120. The wirebond connection may be made before dispense of the second encapsulant material 140, so that when the second encapsulant material 140 is cured, the second encapsulant material 140 may harden around the wirebond connection.

An optional third encapsulant material 150 may be dispensed over the first encapsulant material 130 and/or the second encapsulant material 140 before or after the second encapsulant material 140 has been fully or partially cured. The third encapsulant material 150 may form a meniscus dome over the first encapsulant material 130 and/or the second encapsulant material 140. As with the first encapsulant material 130, the third encapsulant material 150 may cling to a corner 118a or a surface of the second meniscus control feature 118 due, for example, to surface tension in the third encapsulant material 150. The third encapsulant material 150 may include a clear silicone gel, an epoxy resin, and/or any other optically clear encapsulant material. The dispensed third encapsulant material 150 may be cured, for example, by heating the encapsulant material to a suitable temperature for a suitable time period, to cause the third encapsulant material 150 to harden. The third encapsulant material 150 may accordingly form an optically transparent lens over the cured second encapsulant material 140, the reflector 165, and the LED chip 114. The third encapsulant material 150 may include a wavelength conversion material, such as a phosphor and/or a nanocrystal, therein to convert a wavelength of light emitted by the LED chip 114 to a second wavelength. Additionally or alternatively, the third encapsulant material 150 may include an optical scattering material.

When cured, the third encapsulant material 150 or the second encapsulant material 140 may form a lens over the LED chip 114. Furthermore, the third encapsulant material 150 or the second encapsulant material 140 may be molded, cast and/or potted into a desired lens shape after being dispensed onto the substrate 110.

Figure 2D:
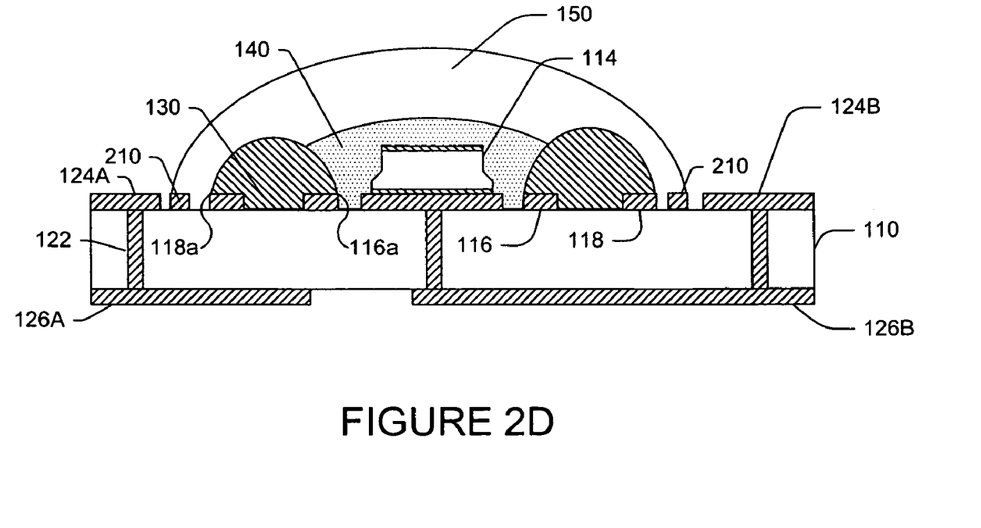
FIG. 2D is a cross sectional view illustrating a light emitting device package according to further embodiments of the invention.

Referring to the FIG. 2D, further embodiments of the invention are illustrated in which a third meniscus control feature 210 is provided outside the second meniscus control feature 118. The third meniscus control feature 210 may be used to control the shape of the third encapsulant material 150. Since the second meniscus control feature 118 is used to control the first encapsulant material 130, it may be difficult for the third encapsulant material 150 to cling to the second meniscus control feature 118. Accordingly, the third meniscus control feature 210 may be provided.

Other shapes may be possible for the first, second and third meniscus control features 116, 118, 210. For example, the meniscus control features could be generally oval and/or polygonal in shape. In some embodiments, the meniscus control features may be continuous features formed on the upper surface 110A of the substrate 110. If the meniscus control features are not continuous features, the meniscus control features may be less likely to confine dispensed encapsulant materials within a desired region. However, it will be understood that for a feature to "surround" a region, the feature need not be continuously formed around the region. Although the figures illustrate continuous meniscus control features, it may be possible for a meniscus control feature to include gaps or voids therein which do not affect the meniscus control function of the feature.

The ability to deliver small volumes of fluids accurately may be desirable in the manufacture of packaged LEDs according to the invention. A variety of different fabrication operations in the semiconductor industry utilize sub-microliter control of fluid dispensing. Such uses may utilize accurate, repeatable and rapid dispensing of precise amounts of fluids. Inaccurate dispensing may adversely impact the yield of a fabrication process.

As discussed above, after the LED chip 114 is mounted on the substrate 110, a microliter quantity of an encapsulant material, such as liquid silicone gel, is dispensed into one or more encapsulant regions. In dispensing the encapsulant material, a bead of the material is typically formed on a dispensing needle and then contacted to surfaces of the substrate 110 and/or the LED chip 114. When the needle is withdrawn, the surface tension between the encapsulant material and surfaces on the substrate 110 and gravity may cause the encapsulant material to tear-off from the dispensing needle and remain on the substrate 110. In some embodiments, the encapsulant material may be dispensed in a desired pattern, for example, a circular pattern, by moving the needle in a circular motion after contacting the bead to the surface of the substrate. In this manner, the desired pattern may be "drawn" onto the substrate with the needle. In other embodiments, the encapsulant material may be dispensed at a location surrounded by one or more meniscus control features and may flow to other locations within the region.

Figure 3:
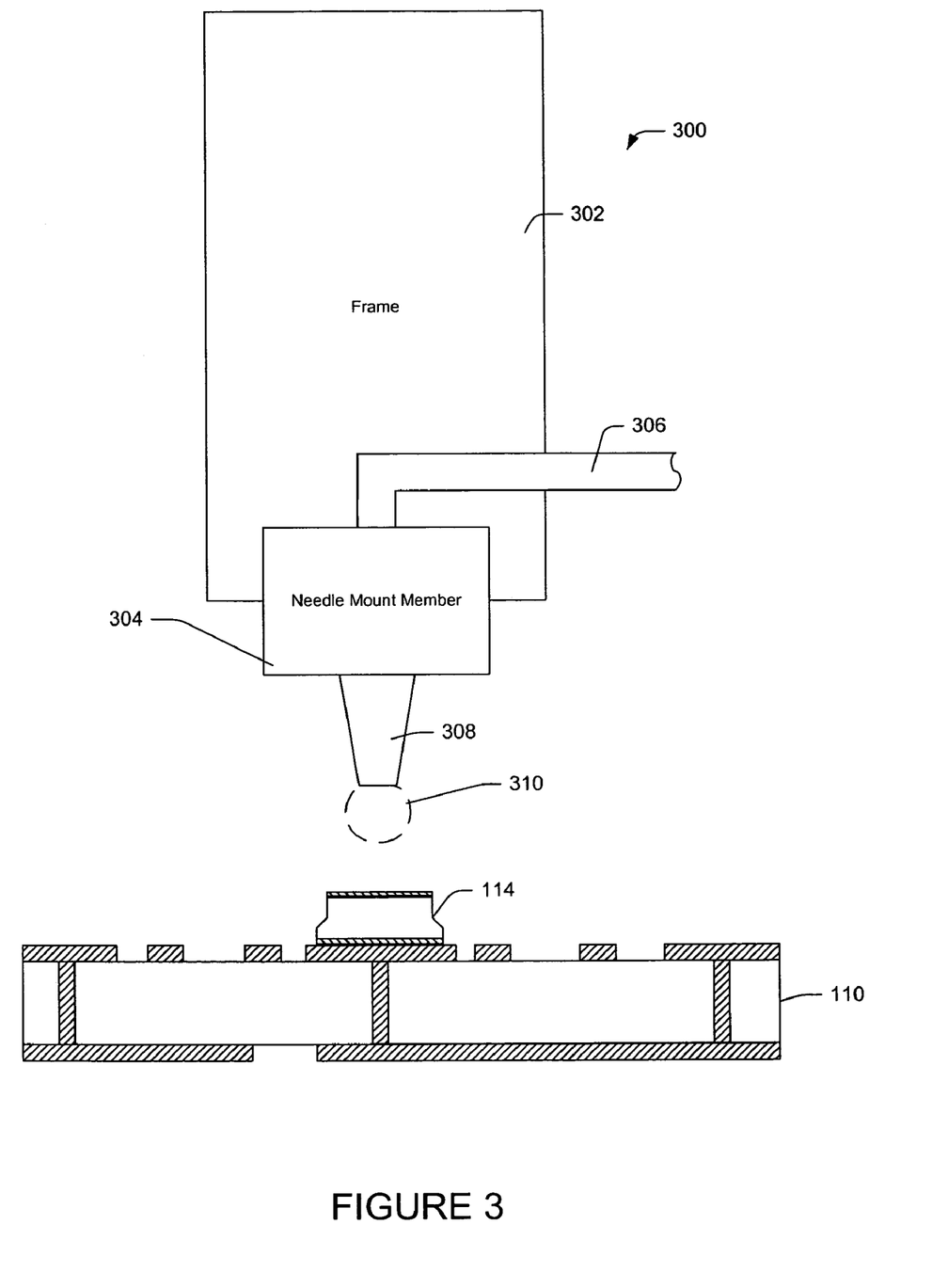
FIG. 3 is a schematic illustration of a system for dispensing an encapsulant material for use in packaging a light emitting device according to some embodiments of the invention.

A system 300 for dispensing an encapsulant material for use in packaging a light emitting device according to some embodiments of the invention is illustrated in FIG. 3. The system 300 includes a frame 302, which may be attached to an articulated arm (not shown) configured to controllably move the frame 302 in the X, Y, and Z dimensions. A needle mount member 304 is mounted on the frame 302, and an encapsulant supply line 306 is coupled to the needle mount member 304 for supplying a quantity of encapsulant material to a hollow dispensing needle 308 mounted on the needle mount member 304. A bead of encapsulant 310 may be formed at the tip of the dispensing needle 408. As discussed above, the bead of encapsulant 310 may be dispensed onto the substrate 110 and/or the LED chip 114 by contacting the bead 310 to a surface of the substrate 110 and/or the LED chip 114. Moreover, in some embodiments, the shape of the dispensed encapsulant may be controlled by moving the frame 302 in the X and Y dimensions as the encapsulant is being dispensed. For example, the encapsulant may be effectively dispensed into an annular region by moving the frame in a circular pattern after contacting the bead 310 to a surface of the substrate 110 within the annular region.

The viscosity and/or other properties of the material used for a dispense may be selected such that, for example, wetting occurs without bubble formation. In further embodiments of the present invention, coatings may be applied to surfaces contacted by the dispensed material to speed/retard the wetting rate. For example, using certain known cleaning procedures that leave microscopic residue, selected surfaces may be treated and, thus, used to engineer the dynamics of the wetting action.

Due to the surface properties of the substrate 110, the LED chip 114 and of the encapsulant material 310, the dispensed encapsulant material may flow in a manner that could cause bubbles to form therein. In particular, the encapsulant material may move or "wick" more rapidly around the sidewalls of the LED chip 114 faster than over the top of the LED chip 114. As a result, a bubble could be trapped on a side of the LED chip 114 opposite from the side where the encapsulant material is dispensed when the side-flowing encapsulant material meets, and then encapsulant material flows over the top of the LED chip 114. Accordingly, when encapsulant material is dispensed into an encapsulant region including the LED chip 114, such as, for example, the encapsulant region 115 illustrated in FIG. 2B, the encapsulant may be pre-dispensed in a first dispense portion adjacent the LED chip 114 selected to substantially cover the LED chip 114 and a second dispense portion selected to fill the encapsulant region 115. The quantity of the first portion of dispensed encapsulant material may be selected to reduce or prevent the risk of forming bubbles around the LED chip 114. As such, as used herein, reference to "substantially" covering the LED chip 114 refers to covering enough of the structure of the LED chip 114 so that such a bubble will not generally result when the remaining portion of the encapsulant material dispensed. After the initially dispensed portion of encapsulant material is allowed to settle, the second portion of the encapsulant material may be dispensed into the encapsulant region.

Figure 4:
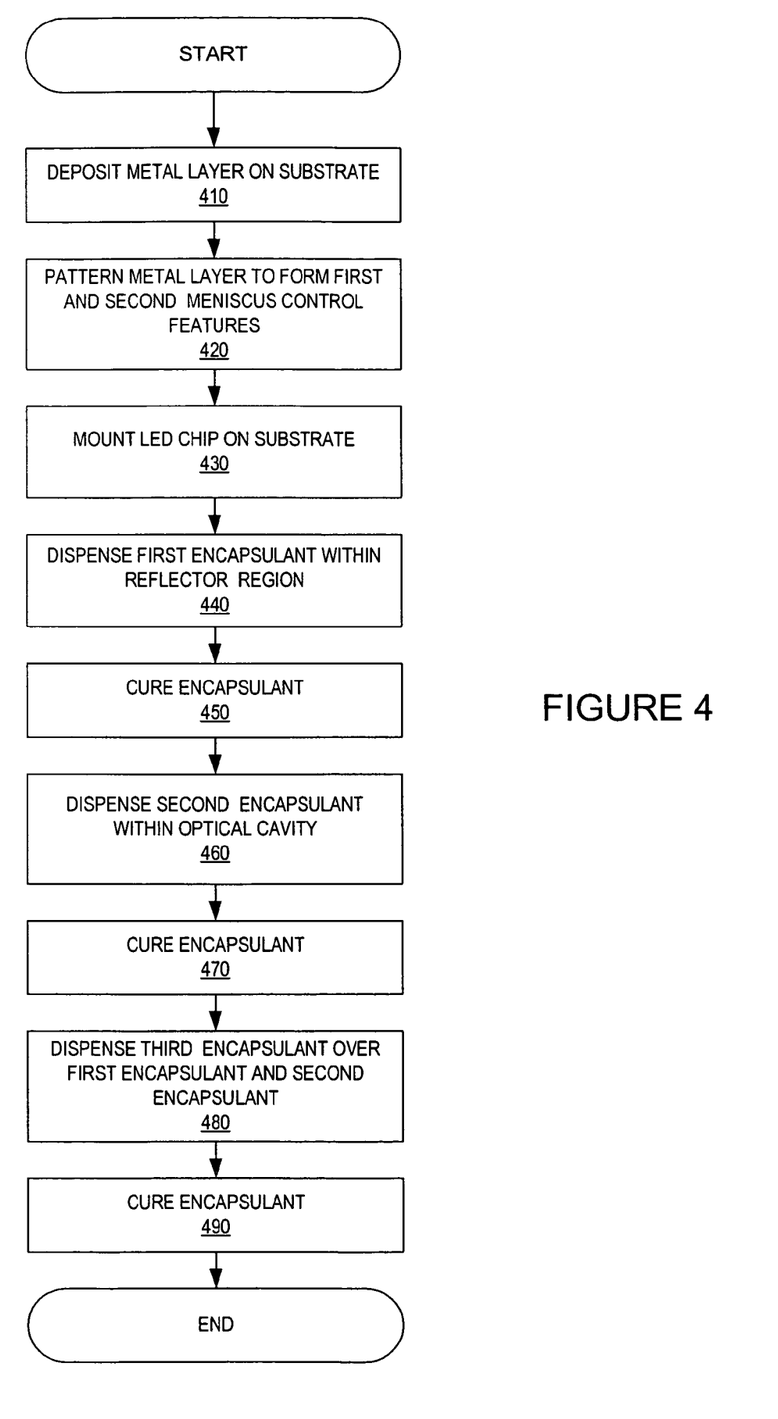
FIG. 4 is a flowchart illustrating operations according to some embodiments of the invention.

Operations associated with forming a packaged LED according to some embodiments of the invention are illustrated in FIG. 4. The operations include depositing a metal layer on a substrate 110 (block 410). The metal layer is patterned to form a die attach pad 112, a first meniscus control feature 116 and a second meniscus control feature 118. Alternatively, the meniscus control features could be selectively deposited on the substrate 110. As discussed above, the first meniscus control feature 116 may surround the die attach pad 112 and define an encapsulant region 115 of the upper surface of the substrate 110. The second meniscus control feature 118 may surround the first encapsulant region 115 and define an annular reflector region 125 of the upper surface of the substrate 110.

The operations may further include mounting an LED chip 114 on the die attach pad 112 (block 430) and dispensing a first encapsulant material 130 within the reflector region 125 defined by the first and second meniscus control features 116, 118 (block 440). The dispensed first encapsulant material 130 may include a reflective material such as an epoxy or a silicone impregnated with a reflective material. Accordingly, the dispensed first encapsulant material 130 may form a reflective ring around the LED chip 114 defining an optical cavity 185 surrounding the LED chip 114.

The dispensed first encapsulant material 130 may be fully or partially cured (block 450) and a second encapsulant material 140 may be dispensed onto the substrate 110 within the optical cavity 185 (block 460). The dispensed second encapsulant material 240 may be cured (block 470).

Continuing with the discussion of FIG. 4, the operations may further include dispensing an optional third encapsulant material 150 over the first encapsulant material 130 and the second encapsulant material (block 480), and curing the third encapsulant material 150 (block 490).

As illustrated above, the dispensed first encapsulant material 130 may define an optical cavity 185 around the LED chip 114, and dispensing the second encapsulant material 140 may include dispensing the second encapsulant material 140 into the cavity 185 around the LED chip 114 after fully or partially curing the first encapsulant material 130. The second encapsulant material 140 and/or the third encapsulant 150 material may include a wavelength conversion material.

Figure 5:
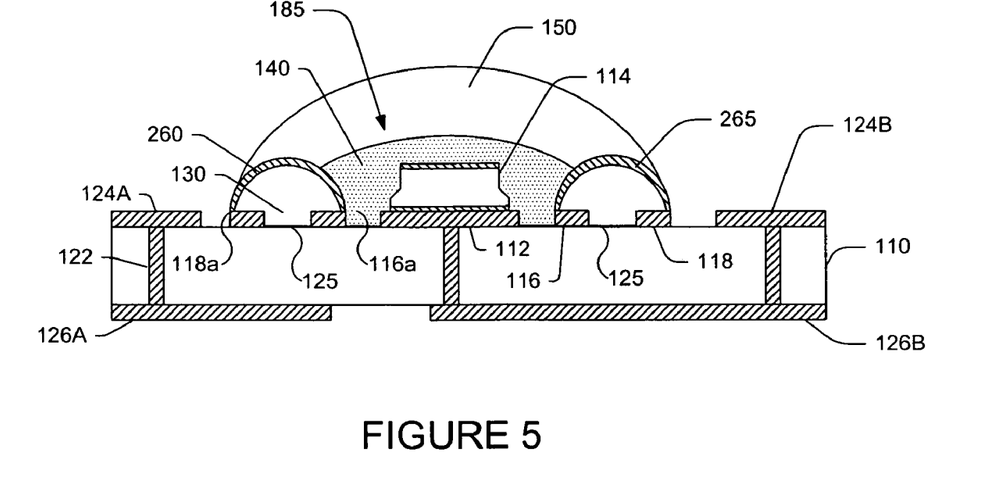
FIGS. 5 and 6 are cross sectional views illustrating a light emitting device packages according to further embodiments of the invention.

Further embodiments according to the invention are illustrated in FIG. 5. As shown therein, the second encapsulant 130 may not include a reflective material. Rather, a reflective coating 260 may be applied to the second encapsulant after it has been dispensed to form a reflector 265. For example, after an annulus of a non-reflective silicone or epoxy is dispensed as a second encapsulant 130, the second encapsulant may be dusted with a reflective material, such as $TiO_2$ or $SiO_2$ powder, metal flakes, etc. The second encapsulant may be uncured and/or partially cured before being dusted with reflective powder, and may be fully cured after dusting. Accordingly, a layer of reflective material 260 is provided on an outer surface of the third encapsulant material 130.

Dusting of the second encapsulant material may be accomplished, for example, with an air jet. Reflective powder blown onto the second encapsulant material 130 may stick only to the uncured and/or partially cured second encapsulant material 130. Excess powder may be lightly blown off of the remainder of the structure. Other methods of applying the reflective powder are possible. For example, the structure may be dipped into a bowl of reflective powder. Since the reflective material is not embedded throughout the second encapsulant material 130, less reflective material may be required. Furthermore, since the reflective material 260 is not mixed into the second encapsulant material 130, cracks may be less likely to form in the second encapsulant material 130 upon curing.

Figure 6:
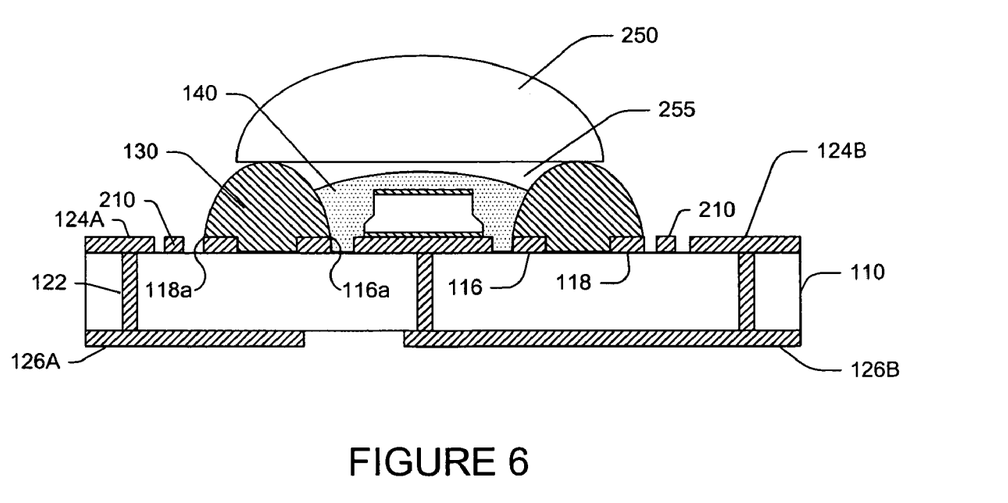

Still further embodiments of the invention are illustrated in FIG. 6. As shown therein, a package may include a separate piece part lens, such as lens 250, which may include, for example, a molded silicone, glass, epoxy or other suitable material. The lens 250 may rest on the second encapsulant 130 lens. Alternatively, the lens 250 could have one or more surfaces that rest on the substrate 110 and/or other features on the substrate 110. A third encapsulant 255, such as a silicone and/or epoxy, may be used as a glue to affix the lens 250 to the structure. The lens 250 may be designed to provide a desired optical pattern, and may have any desired shape such as, for example, a bullet lens, batwing lens, etc.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A packaged LED comprising:
   a substrate;
   an LED chip on the substrate;
   a first encapsulant material including a reflective material on the substrate in a region defined by a first and second meniscus control features comprising concentric traces on the surface of the substrate, the first encapsulant material spaced apart from the LED chip to thereby define an optical cavity around the LED chip and being configured to reflect at least a portion of light emitted by the LED chip; and
   a second encapsulant material within the optical cavity and covering the LED chip.

2. The packaged LED of claim 1, further comprising a third encapsulant material on the first encapsulant material and on the second encapsulant material wherein the third encapsulant material is in direct contact with both the first encapsulant material and the second encapsulant material.

3. The packaged LED of claim 1, wherein the third encapsulant material extends onto the surface of the substrate outside the region in which the first encapsulant material is formed.

4. The packaged LED of claim 3, wherein the third encapsulant material is within a region defined by a third trace on the surface of the substrate.

5. The packaged LED of claim 1, wherein the first encapsulant material forms a generally semi-toroidal three dimensional geometric shape.

6. The packaged LED of claim 1, wherein the first encapsulant material comprises a silver epoxy.

7. The packaged LED of claim 1, wherein the first encapsulant material comprises silicone.

8. The packaged LED of claim 7, wherein the reflective material comprises silver chrome flakes, and/or $TiO_2$ and/or $SiO_2$ particles.

9. The packaged LED of claim 8, wherein the reflective material is coated on the first encapsulant material.

10. The packaged LED of claim 1, wherein the second encapsulant material comprises a wavelength conversion material.

11. The packaged LED of claim 1, further comprising a lens above the second encapsulant material, wherein the reflective material is configured to reflect light emitted from the LED chip through the lens.

12. The packaged LED of claim 2, wherein the third encapsulant material comprises a wavelength conversion material.

13. A packaged LED comprising:
   a submount including a substrate;
   an LED chip on the substrate;
   a first meniscus control feature on the substrate, the first meniscus control feature comprising a first trace on a surface of the substrate and defining an encapsulant region around the LED chip, and
   a second meniscus control feature on the substrate, the second meniscus control feature comprising a second trace on the surface of the substrate and surrounding the encapsulant region and defining a region of the substrate between the first meniscus control feature and the second meniscus control feature;
   a first encapsulant material on the substrate within the region defined by the first meniscus control feature and the second meniscus control feature, the first encapsulant material including a reflective material and defining a cavity around the LED chip; and
   a second encapsulant material within the cavity.

14. The packaged LED of claim 13, further comprising:
   a third meniscus control feature comprising a third trace on the surface of the substrate surrounding the second meniscus control feature; and
   a third encapsulant material directly on the first encapsulant material and the second encapsulant material within a region defined by the third meniscus control feature, wherein the third encapsulant material extends onto the substrate between the second meniscus control feature and the third meniscus control feature.

15. The packaged LED of claim 13, further comprising a third encapsulant material directly on the first encapsulant material and the second encapsulant material.

16. The packaged LED of claim 13, wherein the region of the substrate between the first meniscus control feature and the second meniscus control feature is generally annular.

17. The packaged LED of claim 13, wherein the first and second meniscus control features comprise metal traces.

18. The packaged LED of claim 13, wherein the first and/or second meniscus control features comprises a metal film.

19. The packaged LED of claim 13, wherein the first and second meniscus control features comprise the same material.

20. The packaged LED of claim 19, wherein the first and/or second meniscus control features comprise a plated metal film or a polymer feature.

* * * * *